United States Patent

Kojima

[11] Patent Number: 6,023,080
[45] Date of Patent: *Feb. 8, 2000

[54] INPUT/OUTPUT CONNECTION STRUCTURE OF A SEMICONDUCTOR DEVICE

[75] Inventor: Haruo Kojima, Kawasaki, Japan

[73] Assignee: Kabushiki Kaisha Toshiba, Kawasaki, Japan

[*] Notice: This patent issued on a continued prosecution application filed under 37 CFR 1.53(d), and is subject to the twenty year patent term provisions of 35 U.S.C. 154(a)(2).

[21] Appl. No.: 09/022,123

[22] Filed: Feb. 11, 1998

[30] Foreign Application Priority Data

Feb. 12, 1997 [JP] Japan ................................. 9-027535

[51] Int. Cl.⁷ ........................ H01L 29/80; H01L 31/112; H01L 29/864; H01L 29/40
[52] U.S. Cl. .......................... 257/275; 257/276; 257/728; 257/604; 257/664; 257/734; 333/246; 333/247
[58] Field of Search ........................ 257/692, 728, 257/784, 783, 734, 743, 744, 745, 275, 604, 664; 333/247, 246, 161, 276, 277

[56] References Cited

U.S. PATENT DOCUMENTS 3,387,190  6/1968  Winkler ................................. 257/664
3,753,056  8/1973  Cooke .................................... 257/728
4,996,582  2/1991  Nagahama .............................. 333/247
5,057,805  10/1991 Kadowaki ............................... 257/666
5,371,405  12/1994 Kagawa ................................. 257/664
5,422,615  6/1995  Shibagaki .............................. 257/728
5,532,514  7/1996  Kozono .................................. 257/728
5,717,249  2/1998  Yoshikawa et al. ..................... 257/728

FOREIGN PATENT DOCUMENTS 62-292007  12/1987  Japan .
 5-13631    1/1993  Japan .
 7-240482   9/1995  Japan .

Primary Examiner—Mahshid Saadat
Assistant Examiner—Jesse A. Fenty
Attorney, Agent, or Firm—Oblon, Spivak, McClelland, Maier & Neustadt, P.C.

[57] ABSTRACT

A semiconductor device comprises a dielectric substrate formed on a metal carrier, a semiconductor chip formed on the dielectric substrate and having a first electrode, a microstrip line formed on the dielectric substrate and having a second electrode to be connected to the first electrode, and wires, having different lengths, for connecting the first and second electrodes.

22 Claims, 3 Drawing Sheets

INPUT/OUTPUT CONNECTION STRUCTURE OF A SEMICONDUCTOR DEVICE

BACKGROUND OF THE INVENTION

1. Field of the Invention

The present invention relates to a semiconductor device, and more particularly to an input/output connection structure of a semiconductor device, such as an internal matching type FET encapsulated in a package.

2. Discussion of the Background

FIG. 1 shows an input/output connection structure in which a power FET chip (hereinafter referred to as FET) is use d as a conventional semiconductor chip.

A FET 1 and a dielectric substrate 5 are fixed to a metal carrier 6. Gate electrode 2 and drain electro de 3 of the FET 1 are connected to an input/output upper electrode 7 of a microstrip line by metal wires 4.

When the characteristic impedance of the input/output upper electrode 7 of the dielectric substrate 5 is set to a desired value, the width of the input/output upper electrode 7, the dielectric constant of the dielectric substrate 5 and the thickness thereof are determined. The chip width of the FET 1 is substantially determined by the saturation power of the FET 1.

For this reason, in most cases, the width of the input/output upper electrode 7 of the dielectric substrate 5 does not coincide with the chip width of the FET 1. More specifically, as the saturation power of the FET 1 is higher, the chip width of the FET 1 is greater than the width of the input/output upper electrode 7.

Therefore, in general, the input/output upper electrode 7 has a wider portion as shown in FIG. 1, to which the metal wires 4 are connected. If the electrode 7 does not have a wider portion, metal wires 4 in edge portions of the FET 1 must be longer than those of a central portion in the width direction of the FET 1.

According to the conventional input/output structure, since the width of the input/output upper electrode 7 is greater in the portion to which the metal wires 4 is connected, the amount of phase shift between points A and B in FIG. 1 is greater in edge portions of the FET 1 than that in a central portion in the width direction of the FET 1. As a result, a phase difference occurs between central and edge portions in the width direction of the gate electrode and drain electrode 2 and 3 of the FET 1, resulting in reduction of the maximum available power gain and power load efficiency of the FET 1. The reduction becomes more considerable, as the saturation power of the FET 1 is increased and the frequency is higher.

BRIEF SUMMARY OF THE INVENTION

The present invention has been made in consideration of the above situations, and an object of the present invention is to provide a semiconductor device, in which the phase difference between central and edge portions in the width direction of a gate electrode and drain electrode of a FET is considerably reduced, thereby improving the maximum available power gain and power load efficiency of the FET.

Another object of the present invention is to provide a semiconductor device which allows production of compact and inexpensive high-frequency power amplifiers.

To achieve the above objects, according to a first aspect of the present invention, there is provided a semiconductor device comprising:

a dielectric substrate formed on a metal carrier;

a semiconductor chip formed on the dielectric substrate and having a first electrode;

a microstrip line formed on the dielectric substrate and having a second electrode to be connected to the first electrode; and wires, having different lengths, for connecting the first and second electrodes, wherein the second electrode has a width greater than that of the microstrip line and the lengths of the wires are longer as distances between a center of the second electrode and connecting points of the wires are shorter.

According to a second aspect of the present invention, there is provided a semiconductor device comprising:

a metal carrier;

a dielectric substrate formed on the metal carrier;

a semiconductor chip formed on the metal carrier and having a first electrode;

a microstrip line formed on the dielectric substrate and having a second electrode to be connected to the first electrode; and wires, having different lengths, for connecting the first and second electrodes, wherein the second electrode has a width greater than that of the microstrip line and the lengths of the wires are longer as distances between a center of the second electrode and connecting points of the wires are shorter.

According to a third aspect of the present invention, there is provided a semiconductor device comprising:

a dielectric substrate formed on a metal carrier;

a semiconductor chip formed on the dielectric substrate and having a first electrode; and a microstrip line formed on the dielectric substrate and having a second electrode which is divided into a plurality of electrode patterns to be electrically connected to the first electrode, wherein the plurality of electrode patterns have widths narrower toward a central portion from edge portions of the second electrode.

According to a fourth aspect of the present invention, there is provided a semiconductor device comprising:

a dielectric substrate formed on a metal carrier;

a semiconductor chip formed on the dielectric substrate and having a first electrode; and a microstrip line formed on the dielectric substrate and having a second electrode which is divided into a plurality of electrode patterns to be electrically connected to the first electrode, wherein impedance of the plurality of electrode patterns is higher toward a central portion from edge portions of the second electrode.

According to a fifth aspect of the present invention, there is provided a semiconductor device comprising:

a metal carrier;

a dielectric substrate formed on the metal carrier;

a semiconductor chip formed on the metal carrier and having a first electrode; and a microstrip line formed on the dielectric substrate and having a second electrode which is divided into a plurality of electrode patterns to be electrically connected to the first electrode, wherein the plurality of electrode patterns have widths narrower toward a central portion from edge portions of the second electrode.

According to a sixth aspect of the present invention, there is provided a semiconductor device comprising:

a metal carrier;

a dielectric substrate formed on the metal carrier;

a semiconductor chip formed on the metal carrier and having a first electrode; and a microstrip line formed on the dielectric substrate and having a second electrode which is divided into a plurality of electrode patterns to be electrically connected to the first electrode, wherein impedance of the plurality of electrode patterns is higher toward a central portion from edge portions of the second electrode.

According to a seventh aspect of the present invention, there is provided a monothilic integrated circuit comprising:

a semiconductor chip formed on a dielectric substrate and having a first electrode; and a microstrip line formed on the dielectric substrate and having a second electrode which is divided into a plurality of electrode patterns to be electrically connected to the first electrode, wherein the plurality of electrode patterns have widths narrower toward a central portion from edge portions of the second electrode.

Additional object and advantages of the invention will be set forth in the description which follows, and in part will be obvious from the description, or may be learned by practice of the invention. The object and advantages of the invention may be realized and obtained by means of the instrumentalities and combinations particularly pointed out in the appended claims.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principle of the invention, in which.

DETAILED DESCRIPTION OF THE INVENTION

Figure 2:
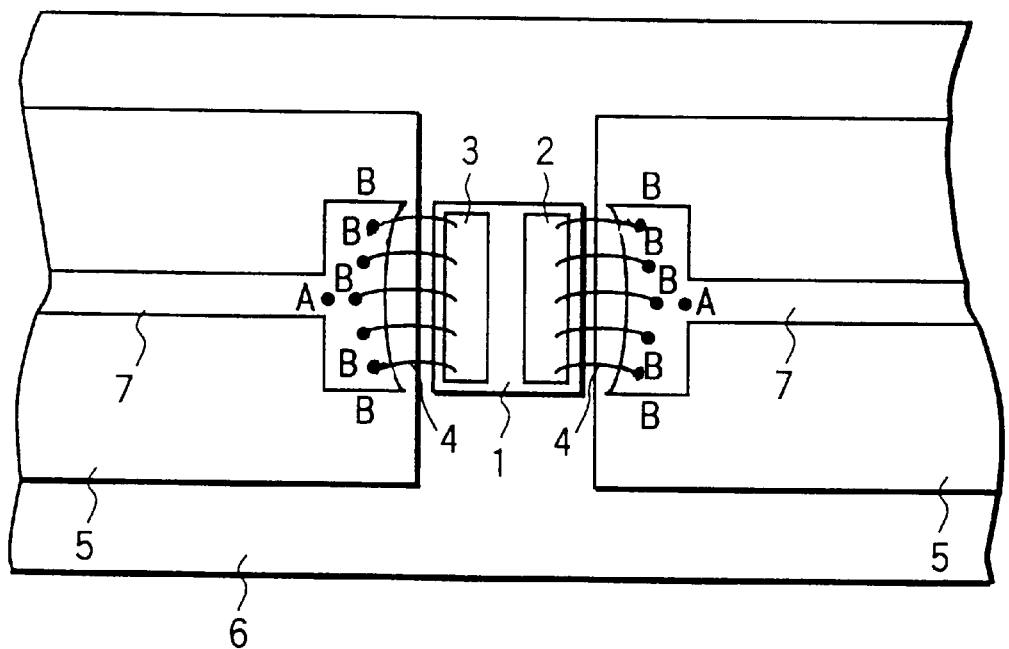
FIG. 2 is a diagram showing an input/output structure of a semiconductor device according to a first embodiment of the present invention.

FIG. 2 is a diagram showing an input/output structure of a semiconductor device according to a first embodiment of the present invention.

A FET 1 and a dielectric substrate 5 are fixed to a metal carrier 6. Gate electrode 2 and drain electrode 3 of the FET 1 are connected to an input/output upper electrode 7 of a microstrip line by metal wires 4.

The input/output upper electrode 7 has a wider portion to which the metal wires 4 are connected (hereinafter referred to as a connecting portion).

That portion of the connecting portion, which faces the FET 1, has a concave pattern. In other words, the side of the connecting portion, which faces the FET 1, is arc-shaped.

The distance between the FET 1 and the side of the connecting portion of the input/output upper electrode 7 is longer in a central portion in the width direction of the FET 1 and shorter in the edge portions thereof.

Connecting points B between the input/output upper electrode 7 and the metal wires 4 are located at the same distance from the side of the concave pattern (arc-shaped side). Therefore, the length of a metal wire 4 is longer in a central portion in the width direction of the FET and shorter in the edge portions thereof.

With the above structure, in the connecting portion of the input/output upper electrode 7, the amount of phase shift between points A and B in FIG. 2 is greater in the edge portions of the FET 1 than that in the central portion in the width direction of the FET 1.

On the other hand, since the length of a metal wire 4 is longer in the central portion and shorter in the edge portions, the amount of phase shift due to the metal wires 4 is greater in the central portion in the width direction of the FET 1 than that in the edge portions. Therefore, the phase difference between the edge portion and the central portion in the width direction of the gate electrode and drain electrode 2 and 3 of the FET 1 can be considerably reduced.

The present inventors carried out a simulation, wherein the thickness of the dielectric substrate 5 was 0.381 mm, the dielectric constant thereof was 9.8, the characteristic impedance of the input/output upper electrode 7 was 50 Ω, the width of the connecting portion of the input/output upper electrode 7 was 1.8 mm, and a 2W-class FET was used as the FET 1. According to the result of the simulation, the maximum available power gain in the frequency band of 14 GHz was improved by about 1.5 dB by virtue of the effect of this structure.

The metal carrier 6 can be substituted for a metal package or a ceramic package having a metal plate, or the gate electrodes 2 and 3 of the FET 1 can be substituted for base and collector electrodes of a bipolar transistor. In those modifications also, the same effect as described above can be obtained.

Figure 1:
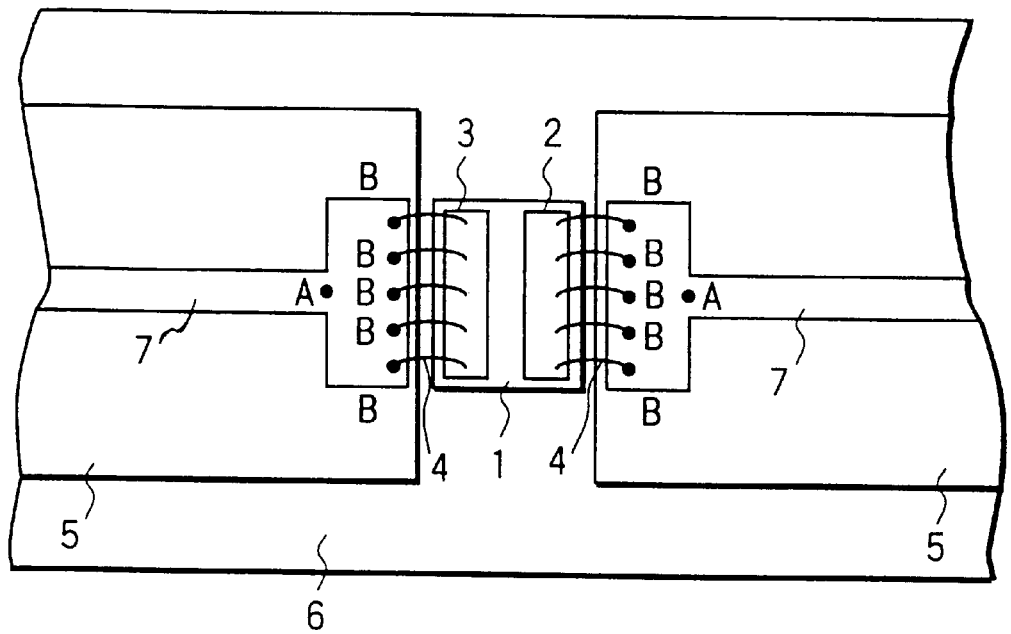
FIG. 1 is a diagram showing an input/output structure of a conventional semiconductor device.
Figure 3:
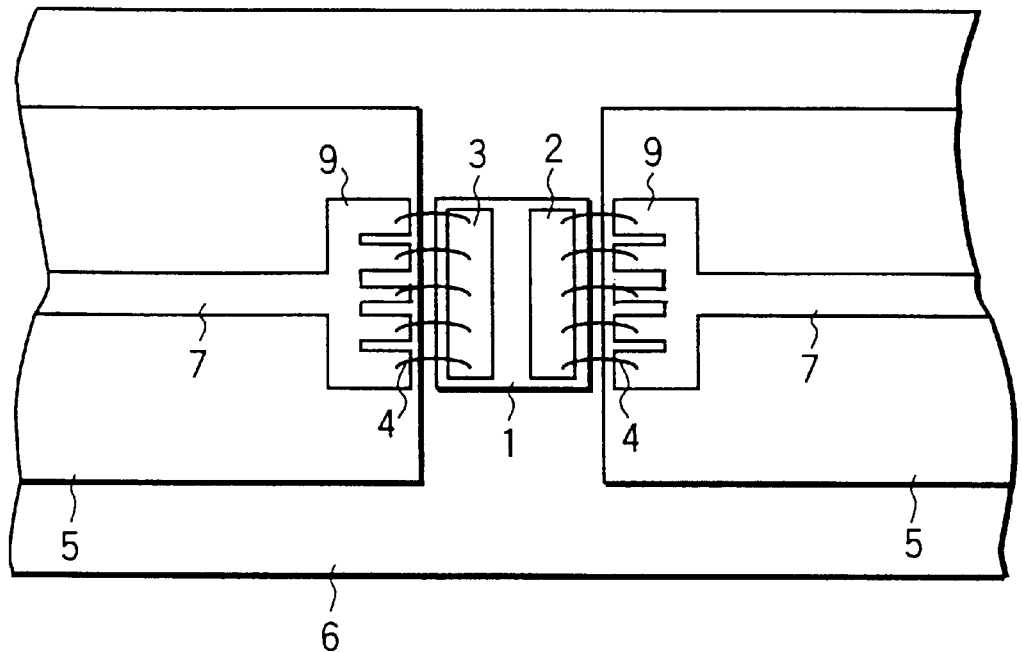
FIG. 3 is a diagram showing an input/output structure of a semiconductor device according to a second embodiment of the present invention.

FIG. 3 is a diagram showing an input/output structure of a semiconductor device according to a second embodiment of the present invention. In the following description, the same reference numerals as those in FIG. 1 are used for the same parts.

A FET 1 and a dielectric substrate 5 are fixed to a metal carrier 6. Gate electrode 2 and drain electrode 3 of the FET 1 are connected to an input/output upper electrode 7 of a microstrip line by metal wires 4.

The input/output upper electrode 7 on the dielectric substrate 5 has a wider portion to which the metal wires 4 are connected (a connecting portion). The input/output upper electrode 7 is divided into a plurality of electrode patterns 9 each of which is formed of a rectangular shape. The widths of the patterns are smaller toward a central portion in the width direction of the FET 1 from the edges of the FET 1.

In this embodiment, since the widths of the patterns are smaller toward the central portion from the edges, the characteristic impedance of the electrode patterns 9 is higher toward the central portion.

Thus, since the electrode patterns 9 are longer toward the edges from the central portion whereas the characteristic impedance of the patterns is lower toward the edges, the phase difference between the edge portion and the central portion in the width direction of the gate electrode 2 and drain electrode 3 of the FET 1 can be considerably reduced.

Figure 4:
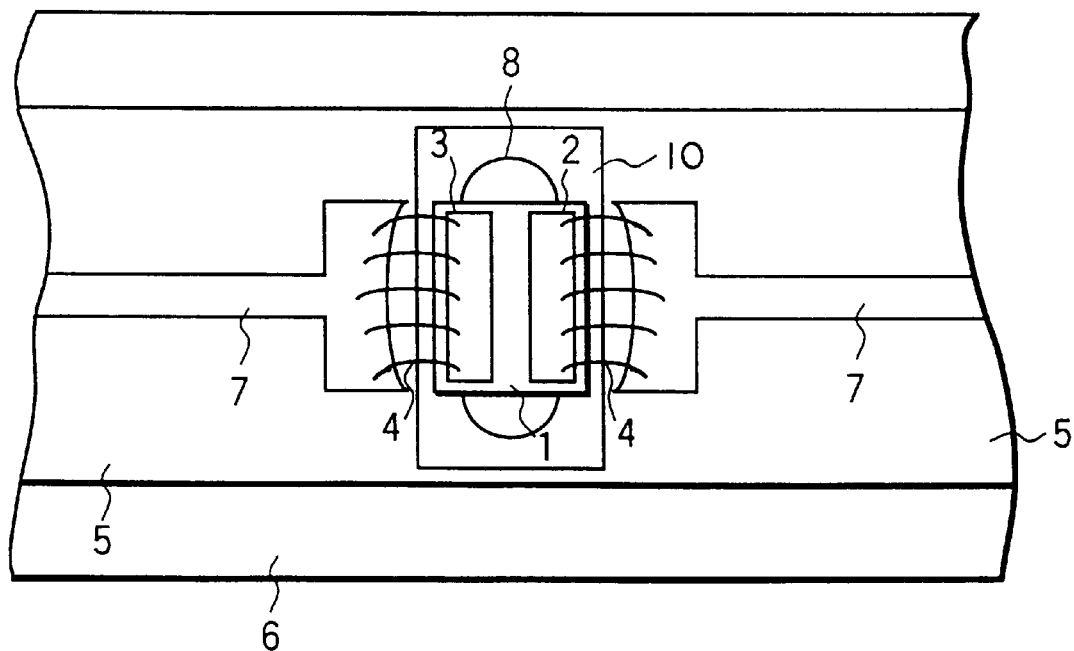
FIG. 4 is a diagram showing an input/output structure of a semiconductor device according to a third embodiment of the present invention.

FIG. 4 is a diagram showing an input/output structure of a semiconductor device according to a third embodiment of the present invention. In the following description, the same reference numerals as those in FIG. 1 are used for the same parts.

A FET 1 and a dielectric substrate 5 are fixed to a metal carrier 6. Gate electrode 2 and drain electrode 3 of the FET 1 are connected to an input/output upper electrode 7 of a microstrip line by metal wires 4.

The input/output upper electrode 7 on the dielectric substrate 5 has a wider portion to which the metal wires 4 are connected (a connecting portion). The lengths of the metal wires are longer toward a central portion in the width direction of the FET 1 from the edges of the FET 1.

A metal-buried via hole 8, which is filled with metal such as tungsten, is formed on the dielectric substrate 5 immediately under the FET 1 on a ground pad 10 to ground the FET 1 to the metal carrier 6.

With the above structure, the amount of phase shift in the connecting portion of the input/output upper electrode 7 is greater toward the edge portion from the central portion in the width direction of the FET 1.

Further, since the length of a metal wire 4 is longer in the central portion and shorter in the edge portions, the amount of phase shift due to the metal wires 4 is greater in the central portion in the width direction of the FET 1 than that in the edge portions thereof. Therefore, the phase difference between the edge portion and the central portion in the width direction of the gate electrode 2 and drain electrode 3 of the FET 1 can be considerably reduced.

Figure 5:
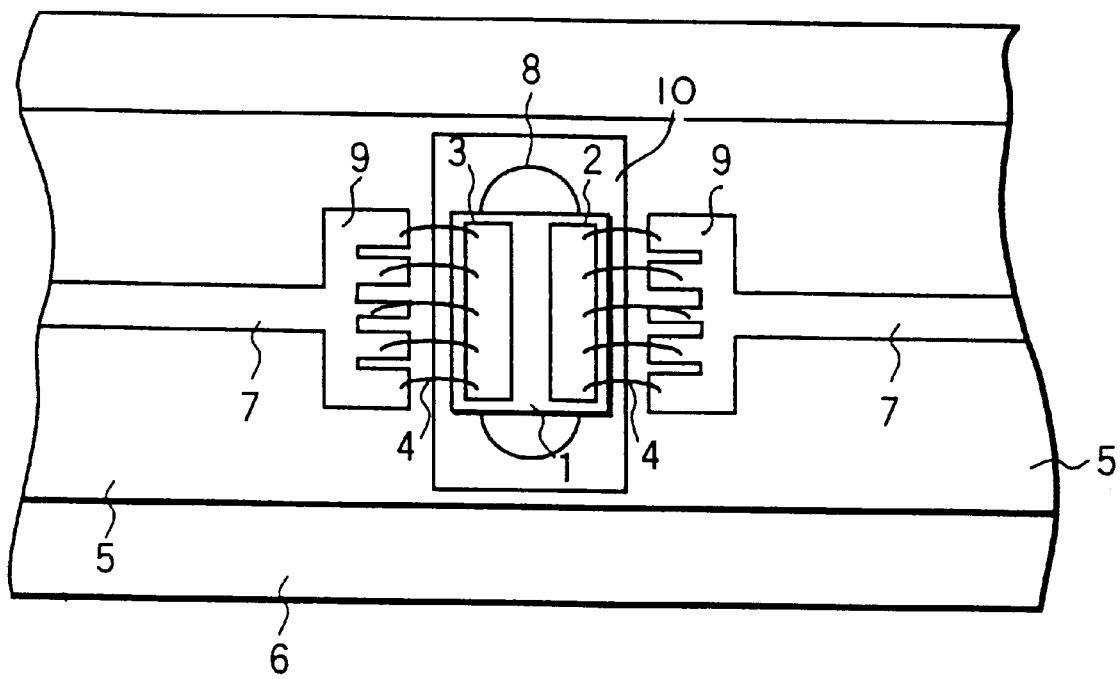
FIG. 5 is a diagram showing an input/output structure of a semiconductor device according to a fourth embodiment of the present invention.

FIG. 5 is a diagram showing an input/output structure of a semiconductor device according to a fourth embodiment of the present invention. In the following description, the same reference numerals as those in FIG. 1 are used for the same parts.

A FET 1 and a dielectric substrate 5 are fixed to a metal carrier 6. Gate electrode 2 and drain electrode 3 of the FET 1 are connected to an input/output upper electrode 7 of a microstrip line by metal wires 4.

The input/output upper electrode 7 on the dielectric substrate 5 has a wider portion to which the metal wires 4 are connected (connecting portion). The characteristic impedance of the electrode patterns 9 is higher toward the central portion in the width direction of the FET 1 from the edge portions.

A metal-buried via hole 8, which is filled with metal such as tungsten, is formed on the dielectric substrate 5 immediately under the FET 1 to connect the FET 1 to the metal carrier 6.

Thus, with the above structure, since the widths of the electrode patterns 9 are smaller toward the central portion from the edges whereas the characteristic impedance of the patterns is higher toward the central portion, the phase difference between the edge portion and the central portion in the width direction of the gate electrode and drain electrode 2 and 3 of the FET 1 can be considerably reduced.

Figure 6:
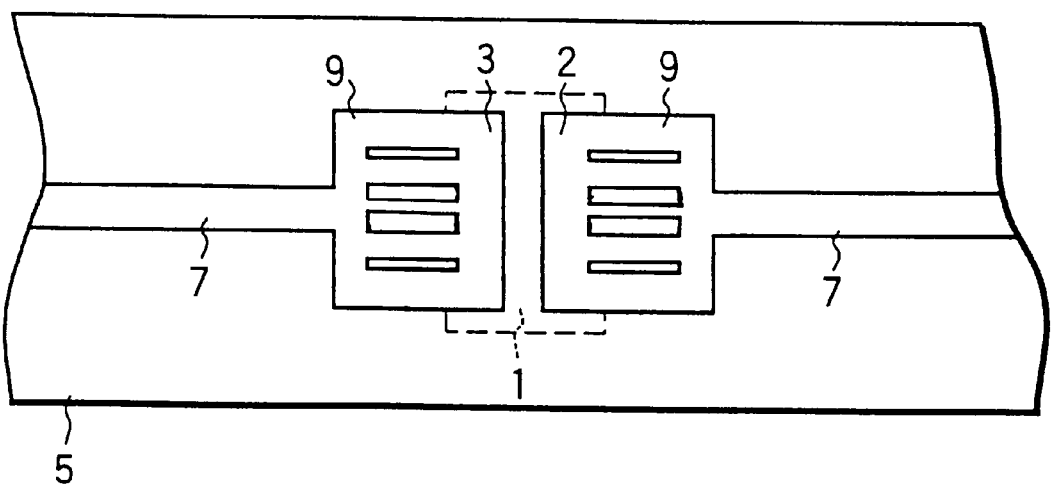
FIG. 6 is a diagram showing an input/output structure of a semiconductor device according to a fifth embodiment of the present invention.

FIG. 6 is a diagram showing an input/output structure of a semiconductor device according to a fifth embodiment of the present invention. In the following description, the same reference numerals as those in FIG. 1 are used for the same parts.

A FET 1 and an input/output upper electrode 7 of a microstrip line are formed on a dielectric substrate 5. The input/output upper electrode 7 is divided into a plurality of electrode patterns 9 on the side of gate electrode 2 and drain electrode 3 of the FET 1.

The widths of the patterns are smaller toward a central portion in the width direction of the FET 1 from the edges of the FET 1. Accordingly, the characteristic impedance of the electrode patterns 9 is higher toward the central portion in the width direction of the FET 1 from the edge portions thereof.

The electrode patterns 9 are directly connected to the gate electrode and drain electrode 2 and 3 of the FET 1, without metal wires, thus forming a monolithic microwave IC structure.

Thus, with the above structure, since the widths of the electrode patterns 9 are smaller toward the central portion from the edges whereas the characteristic impedance of the patterns is higher toward the central portion, the phase difference between the edge portion and the central portion in the width direction of the gate electrode and drain electrode 2 and 3 of the FET 1 can be considerably reduced.

As described above, according to the present invention, it is possible to considerably reduce the phase difference between central and edge portions in the width direction of gate electrode and drain electrode of a FET and improve the maximum available power gain and power load efficiency of the FET.

Further, it is possible to provide an input/output connection structure of a semiconductor device which allows production of compact and inexpensive high-frequency power amplifiers.

As has been described above in detail, according to the present invention, a compact and inexpensive high-frequency power amplifier can be obtained.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalent.

I claim:

1. A semiconductor device comprising:
   a dielectric substrate formed on a metal carrier;
   a semiconductor chip formed on the dielectric substrate and having a first electrode;
   a microstrip line formed on the dielectric substrate and having a second electrode with a narrow portion and with a connecting portion having a width which is wider than that of the narrow portion, the connecting portion to be connected to the first electrode; and
   wires, having different lengths, for connecting the first and second electrodes,
   wherein each length of the wires is determined to reduce phase difference of current flowing between the first electrode and the narrow portion of the second electrode by the wires.

2. The semiconductor device according to claim 1, wherein the second electrode has a side which faces the semiconductor chip and the side is arc-shaped and each of the wires has one end connected to the second electrode and each one end is located at a same distance from the side.

3. The semiconductor device according to claim 2, wherein each length of the wires is determined based on a distance between the microstrip line and the one end thereof.

4. The semiconductor device according to claim 1, wherein a via hole filled with a metal is formed in the dielectric substrate and the semiconductor chip is connected to the metal carrier through the via hole.

5. A semiconductor device comprising:
   a metal carrier;
   a dielectric substrate formed on said metal carrier;
   a semiconductor chip formed on said metal carrier and having a first electrode;
   a microstrip line formed on the dielectric substrate and having a second electrode with a narrow portion and with a connecting portion having a width which is wider than that of the narrow portion, the connecting portion to be connected to the first electrode; and
   wires, having different lengths, for connecting the first and second electrodes, each length of the wires is determined to reduce phase difference of current flowing between the first electrode and the narrow portion of the second electrode by the wires.

6. The semiconductor device according to claim 5, wherein the second electrode has a side which faces the semiconductor chip and the side is arc-shaped and each of the wires has one end connected to the second electrode and each one end is located at a same distance from the side.

7. The semiconductor device according to claim 6, wherein each length of the wires is determined based on a distance between the microstrip line and the one end thereof.

8. The semiconductor device according to claim 5, wherein a via hole filled with a metal is formed in the dielectric substrate and the semiconductor chip is connected to the metal carrier through the via hole.

9. A semiconductor device comprising:
   a dielectric substrate formed on a metal carrier;
   a semiconductor chip formed on the dielectric substrate and having a first electrode; and
   a microstrip line formed on the dielectric substrate and having a second electrode which is divided into a plurality of electrode patterns to be electrically connected to the first electrode,
   wherein the plurality of electrode patterns have different widths which become smaller from most outer ones of the plurality of electrode patterns toward a central one of the plurality of electrode patterns, and each of the widths is determined to reduce phase difference of current flowing between the first electrode and the second electrode by the plurality of the electrode patterns.

10. The semiconductor device according to claim 9, wherein the second electrode has a width greater than that of the microstrip line.

11. The semiconductor device according to claim 9, wherein a via hole filled with a metal is formed in the dielectric substrate and the semiconductor chip is connected to the metal carrier through the via hole.

12. A semiconductor device comprising:
    a dielectric substrate formed on a metal carrier;
    a semiconductor chip formed on the dielectric substrate and having a first electrode; and
    a microstrip line formed on the dielectric substrate and having a second electrode which is divided into a plurality of electrode patterns to be electrically connected to the first electrode,
    wherein the plurality of electrode patterns have different impedances which become higher from most outer ones of the plurality of electrode patterns toward a central one of the plurality of electrode patterns, and the impedances of the plurality of electrode patterns are determined so as to reduce phase difference of current flowing between the first electrode and the second electrode by the plurality of the electrode patterns.

13. The semiconductor device according to claim 12, wherein the second electrode has a width greater than that of the microstrip line.

14. The semiconductor device according to claim 12, wherein a via hole filled with a metal is formed in the dielectric substrate and the semiconductor chip is connected to the metal carrier through the via hole.

15. A semiconductor device comprising a metal carrier;
    a dielectric substrate formed on said metal carrier;
    a semiconductor chip formed on said dielectric substrate and in contact with said metal carrier and having a first electrode; and
    a microstrip line formed on the dielectric substrate and having a second electrode which is divided into a plurality of electrode patterns to be electrically connected to the first electrode,
    wherein the plurality of electrode patterns have different widths which become smaller from most outer ones of the plurality of electrode patterns toward a central one of the plurality of electrode patterns, and each of the widths is determined to reduce phase difference of current flowing between the first electrode and the second electrode by the plurality of the electrode patterns.

16. The semiconductor device according to claim 15, wherein the second electrode has a width greater than that of the microstrip line.

17. The semiconductor device according to claim 15, wherein a via hole filled with a metal is formed in the dielectric substrate and the semiconductor chip is connected to the metal carrier through the via hole.

18. A semiconductor device comprising:
    a metal carrier;
    dielectric substrate formed on said metal carrier;
    a semiconductor chip formed in contact with said metal carrier and having a first electrode; and
    a microstrip line formed on the dielectric substrate and having a second electrode which is divided into a plurality of electrode patterns to be electrically connected to the first electrode,
    wherein the plurality of electrode patterns have different impedances which become higher from most outer ones of the plurality of electrode patterns toward a central one of the plurality of electrode patterns, and the impedances of the plurality of electrode patterns are determined to reduce phase difference of current flowing between the first electrode and the second electrode by the plurality of electrode patterns.

19. The semiconductor device according to claim 18, wherein the second electrode has a width greater than that of the microstrip line.

20. The semiconductor device according to claim 18, wherein a via hole filled with a metal is formed in the dielectric substrate and the semiconductor chip is connected to the metal carrier through the via hole.

21. A monolithic integrated circuit comprising:

a semiconductor chip formed on a dielectric substrate and having a first electrode; and a microstrip line formed on the dielectric substrate and having a second electrode which is divided into a plurality of electrode patterns to be electrically connected to the first electrode, wherein the plurality of electrode patterns hare different widths which become smaller from most outer ones of the plurality of electrode patterns toward a central one of the plurality of electrode patterns, and each of the widths is determined to reduce phase difference of current flowing between the first electrode and the second electrode by the plurality of the electrode patterns.

22. The semiconductor device according to claim 21, wherein the second electrode has a width greater than that of the microstrip line.

* * * * *